(12) United States Patent
Schoellkopf

(10) Patent No.: US 7,307,891 B2
(45) Date of Patent: Dec. 11, 2007

(54) FAST MEMORY CIRCUITS AND METHODS

(75) Inventor: Jean-Pierre Schoellkopf, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/157,133

(22) Filed: Jun. 20, 2005

(65) Prior Publication Data
US 2005/0281091 A1 Dec. 22, 2005

(30) Foreign Application Priority Data
Jun. 18, 2004 (FR) .................................. 04 51190

(51) Int. Cl.
*G11C 7/10* (2006.01)
(52) U.S. Cl. .......................... 365/189.01; 365/203.05; 365/154
(58) Field of Classification Search ........... 365/189.01, 365/203.05, 154, 156, 189.04, 189.12, 230.06
See application file for complete search history.

(56) References Cited

U.S. PATENT DOCUMENTS

| 6,078,527 | A | 6/2000 | Roth et al. |
| 6,181,634 | B1* | 1/2001 | Okita ..................... 365/230.05 |
| 6,751,151 | B2* | 6/2004 | Hsu et al. .............. 365/230.05 |
| 6,816,955 | B1 | 11/2004 | Raza et al. ................. 711/168 |
| 6,839,291 | B2* | 1/2005 | Shin ........................... 365/194 |
| 2002/0112119 | A1 | 8/2002 | Halbert et al. |

OTHER PUBLICATIONS

French Search Report, FR0451190, Mar. 15, 2005.

* cited by examiner

*Primary Examiner*—Van Thu Nguyen
*Assistant Examiner*—Dang Nguyen
(74) *Attorney, Agent, or Firm*—Graybeal Jackson Haley LLP

(57) ABSTRACT

A storage circuit using a dual-access memory includes means for alternately activating one access, then the other, with a maximum frequency equal to twice the maximum possible frequency of activation of a given access. At least two successive activations of the means control operations of the same type, either reading or writing operations.

21 Claims, 3 Drawing Sheets

FAST MEMORY CIRCUITS AND METHODS

PRIORITY CLAIM

This application claims priority from French patent application No. 04/51190, filed Jun. 18, 2004, which is incorporated herein by reference.

BACKGROUND OF THE INVENTION

1. Field of the Invention

The present invention relates to a fast integrated circuit memory.

2. Discussion of the Related Art

In modern integrated circuits, the circuit operating frequency is frequently limited by the maximum operating frequency of the memories, the maximum frequency of a memory corresponding to the minimum duration necessary to read or write a memory point.

SUMMARY OF THE INVENTION

An aspect of the present invention is to provide an integrated circuit structure enabling increasing the maximum operating frequency of its memories.

According to one aspect, the present invention provides a storage circuit using a dual-access memory, including means for alternately activating one access, then the other, with a maximum frequency equal to twice the maximum possible frequency of activation of a given access, at least two successive activations of said means controlling operations of the same type, reading or writing.

According to an aspect of the present invention, each access of said dual-access memory comprises a group of control inputs enabling controlling a read or write operation in a memory point.

According to an aspect of the present invention, the dual-access memory is synchronous, each group of control inputs comprising a clock input, the clock signal received on this clock input being a periodic signal, the signals received on the other control inputs of a group of control inputs being sampled on an edge, rising or falling, of the clock signal received on the clock input of the considered group of control inputs.

According to an aspect of the present invention, said means for alternately activating one access, then the other, provide first and second clock signals from a reference clock signal, the first and second clock signals having a frequency which is half that of the reference clock signal and being in phase opposition, the first clock signal controlling the clock input of one of the groups of memory control inputs, the second clock signal controlling the clock input of the other group of memory control inputs.

According to an aspect of the present invention, each group of control inputs comprises an address input, a memory selection input, and a read/write input.

According to an aspect of the present invention, the two input addresses receive a same address signal, the two memory selection inputs receive a same memory selection signal, and the two write/read inputs receive a same write/read signal.

According to an aspect of the present invention, said dual-access memory comprises two data inputs through which are input data which are desired to be written into the memory, each data input being associated with a group of control inputs, the two data inputs receiving a same data input signal.

According to an aspect of the present invention, the memory comprises two data outputs on which the values read from the memory can be obtained, each data output being associated with a group of control inputs.

According to an aspect of the present invention, the two memory data outputs are connected to two inputs of a multiplexer controlled by one of the first and second clock signals.

According to an aspect of the present invention, said memory comprises two output validation inputs allowing or not data transmission on each of the data outputs, the two data outputs being connected to a same data output, the validation inputs receiving complementary control signals.

According to an aspect of the present invention, said dual-access memory is an asynchronous memory, a read or write operation being launched when one of the inputs of a group of control inputs switches state.

Another aspect of the present invention also provides a method for activating a dual-access memory consisting of alternately activating one access, then the other, with a maximum frequency equal to twice the maximum possible frequency of activation of a given access, at least two successive activations controlling operations of the same type, reading or writing The foregoing features and advantages of the present invention will be discussed in detail in the following non-limiting description of specific embodiments in connection with the accompanying drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
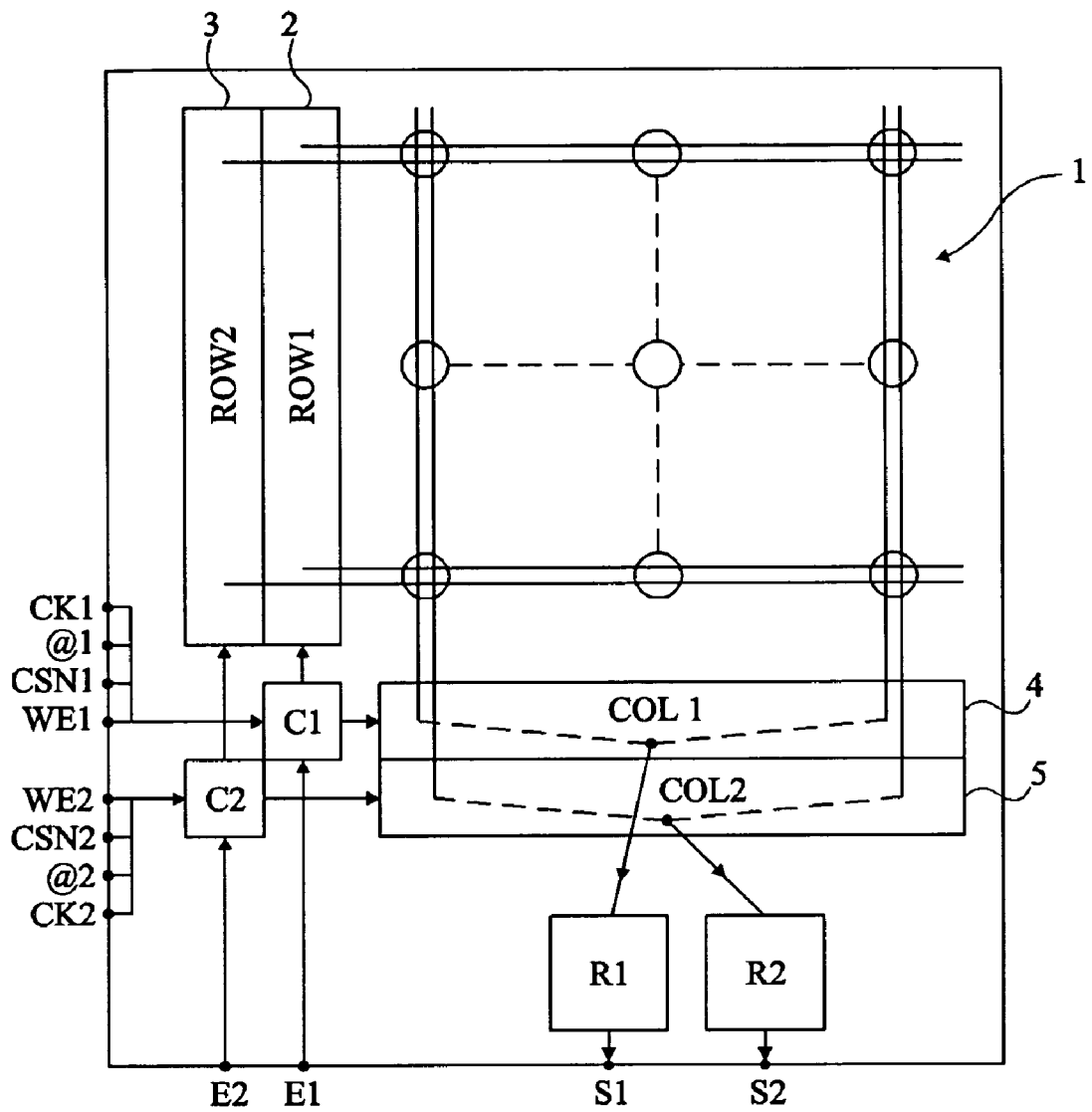
FIG. 1 is a diagram of a dual-access memory.

FIG. 1 is a diagram of a dual-access memory comprising an array of memory points 1, a few memory points being represented by circles. Each memory point 1 is connected to a pair of horizontal row lines and to a pair of vertical column lines. Each pair of row lines is connected to two decoders of a row ROW1/ROW2 2 and 3, each row decoder enabling activation of one of the lines of each pair of row lines. Similarly, each pair of column lines is connected to two decoders of a column (COL1/COL2) 4 and 5, each column decoder enabling activation of one of the lines of each pair of column lines. A control circuit C1 drives decoder 2 of row ROW1 and decoder 4 of column COL1, and a control circuit C2 drives decoder 3 of row ROW2 and decoder 5 of column COL2. Each of control circuits C1 and C2 is connected to a group of control inputs. Each group of control inputs comprises in this example a clock input CK1/CK2, an address input @1/@2, a memory selection input CSN1/CSN2, and a read/write input WE1/WE2. Two write circuits R1 and R2 are connected on the one hand to the decoders of a column COL1/COL2 4 and 5 and on the other hand to two data outputs S1 and S2 of the memory. In the case where it is possible to perform writings into the memory, control circuits C1 and C2 are respectively connected to two data inputs E1 and E2.

Control inputs CK1, @1, CSN1, WE1, CK2, @2, CSN2, and WE2 and data inputs E1 and E2 receive signals and data outputs S1 and S2 transmit signals. In the following description, a signal reaching a control input X, clock input CK1, for example, will be called control signal X, that is, control signal CK1 in our example. Similarly, a signal reaching a data input E1, E2 or transmitted by a data output S1, S2 will respectively be called input signal E1, E2, or output signal S1, S2.

Two operations such as a reading or a writing may be performed simultaneously. The starting of an operation in the dual-access memory is performed by activation of one of the control input groups {CK1/@1/CSN1/WE1} or {WE2 (CSN2/@2/CK2}. Generally, a dual-access memory comprises a conflict-management circuit, not shown, to avoid for two writings into a same memory point with different values to be simultaneously launched.

When the dual-access memory is synchronous, address signal @1/@2, memory selection signal CSN1/CSN2, and read/write signals WE1 and WE2 are sampled on a rising or falling edge of clock signal CK1 or CK2. If memory selection signal CSN1/CSN2 indicates that the memory is selected, then a read or write operation is performed at the address indicated by address signal @1/@2. Read/write signal WE1/WE2 indicates whether a writing or a reading is requested. In the case where a reading is requested, control circuit C1 or C2 activates the row and column decoders to which it is connected to select the memory point corresponding to the required address. The value present in the selected memory point is then transmitted onto output S1 or S2. Similarly, when a writing is required, control circuit C1 or C2 activates the associated row and column decoders to write into the selected memory point the value present on data input E1 or E2.

Figure 2:
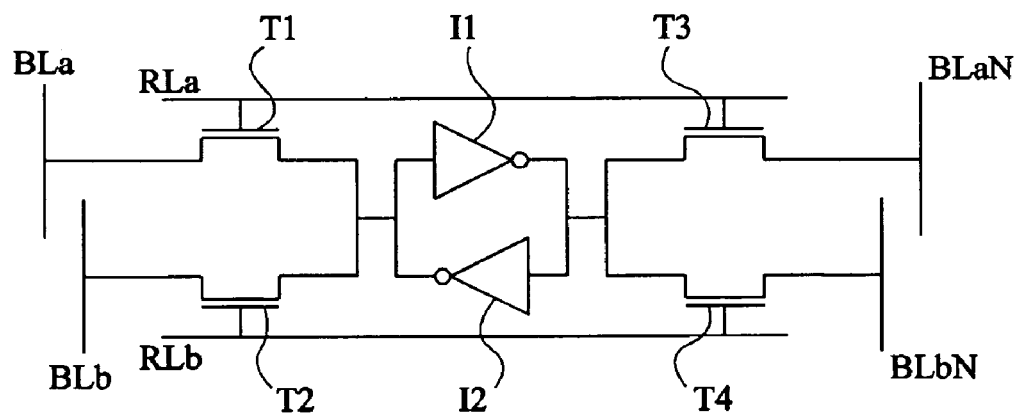
FIG. 2 is a diagram of a memory point of a SRAM-type dual-access memory.

FIG. 2 is an example of a memory point of a SRAM-type dual-access memory. The memory point comprises four access transistors T1, T2, T3, and T4 and two inverters I1 and I2, the output of one of the inverters being connected to the input of the other one. The output of inverter I2 is connected to a drain/source area of each of transistors T1 and T2, the other drain/source area of each of transistors T1 and T2 being respectively connected to a bit line BLa or BLb. Similarly, the output of inverter I1 is connected to a source/drain area of each of transistors T3 and T4, the other drain/source area of transistors T3 and T4 being respective connected to a bit line BLaN and BLbN. Transistors T1 and T3 are controlled by a row line RLa and transistors T2 and T4 are controlled by a row line RLb. The pair of row lines RLa/RLb is connected to row decoder 2 and 3 of the dual-access memory. Bit lines BLa and BLaN are connected to decoder 4 of column COL1 and bit lines BLb and BLbN are connected to decoder 5 of column COL2.

Figure 3:
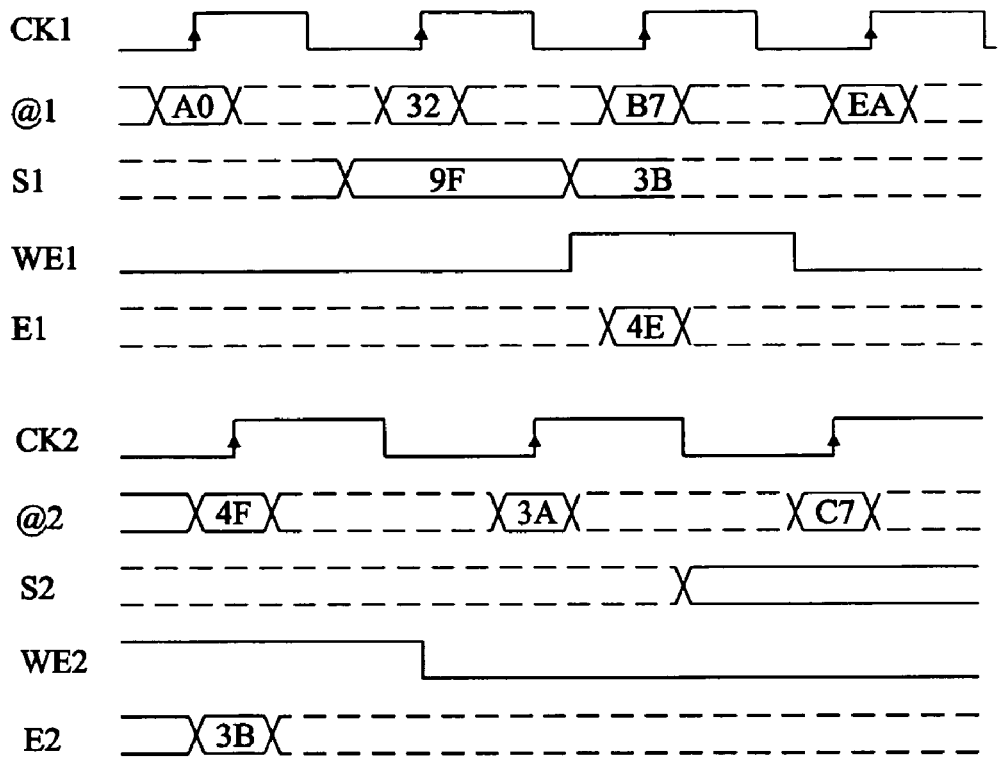
FIG. 3 is a timing diagram illustrating the values taken by various signals of the circuit of FIG. 1.

FIG. 3 is a timing diagram illustrating values taken by various signals of the circuit of FIG. 1. Clock signals CK1 and CK2 are periodic signals, the frequency of clock signal CK1 being in this example greater than that of clock signal CK2. Four rising edges of clock signal CK1 and three rising edges of clock signal CK2 are shown in FIG. 3.

Address signals @1 and @2 are in this example sampled on each rising edge of clock signals CK1 and CK2. Conventionally, to avoid sampling errors, address signals @1 and @2 must be positioned little before the rising edge of clock CK1 to CK2 and remain unchanged for a short time after the rising edge. Examples of address values taken by address signals @1 and @2 will be given in hexadecimal notation.

Read/write signals WE1 and WE2 are also sampled on each rising edge of clock signals CK1 and CK2. In this example, a level "0" corresponds to a read request, a level "1" corresponds to a write request. Write/read signal WE1 is at level "0" at the first two rising edges of clock signal CK1, at level "1" at the third rising edge, then back at level "0". Read/write signal WE2 is at level "1" at the first rising edge of clock signal CK2, then at level "0" at the next rising edges.

The reading from a memory point is started on a rising edge of a clock signal CK1 or CK2. Control circuit C1 or C2 then activates decoders of row ROW1/ROW2 and of column COL1/COL2, followed by read circuit R1 or R2. The data stored at the address indicated by the address signal at the rising edge of signal CK1 or CK2 are then provided at output S1 or S2. In this example, the read data are available at the output after a duration substantially corresponding to half the period of clock signal CK2 and to ⅔ of the period of clock signal CK1. Examples of read values are given in hexadecimal notation.

The writing into a memory point is started on a rising edge of a clock signal CK1 or CK2. Control circuit C1 or C2 activates the decoders of row ROW1/ROW2 and of column COL1/COL2 and the data present on input E1 or E2 on the rising edge of clock CK1 or CK2 are written at the address indicated by the address signal in this same rising edge of signal CK1 or CK2.

A dual-access memory such as described previously substantially corresponds to two memories Mem1 and Mem2 sharing a same memory point array. Referring to FIG. 1, memory Mem1 would comprise decoder 2 of ROW1, control circuit C1, the decoder of column COL1 4, and write circuit R1. Similarly, memory Mem2 would comprise the decoder of row ROW2 3, control circuit C2, decoder 5 of column COL2, and write circuit R2. Conventionally, a dual-access memory is essentially used to enable asynchronously performing "simultaneous" memory read and write operations.

According to an embodiment of the present invention, the two memories Mem1 and Mem2 of a dual-access memory are used to obtain the equivalent of a twice as fast single-access memory.

Figure 4:
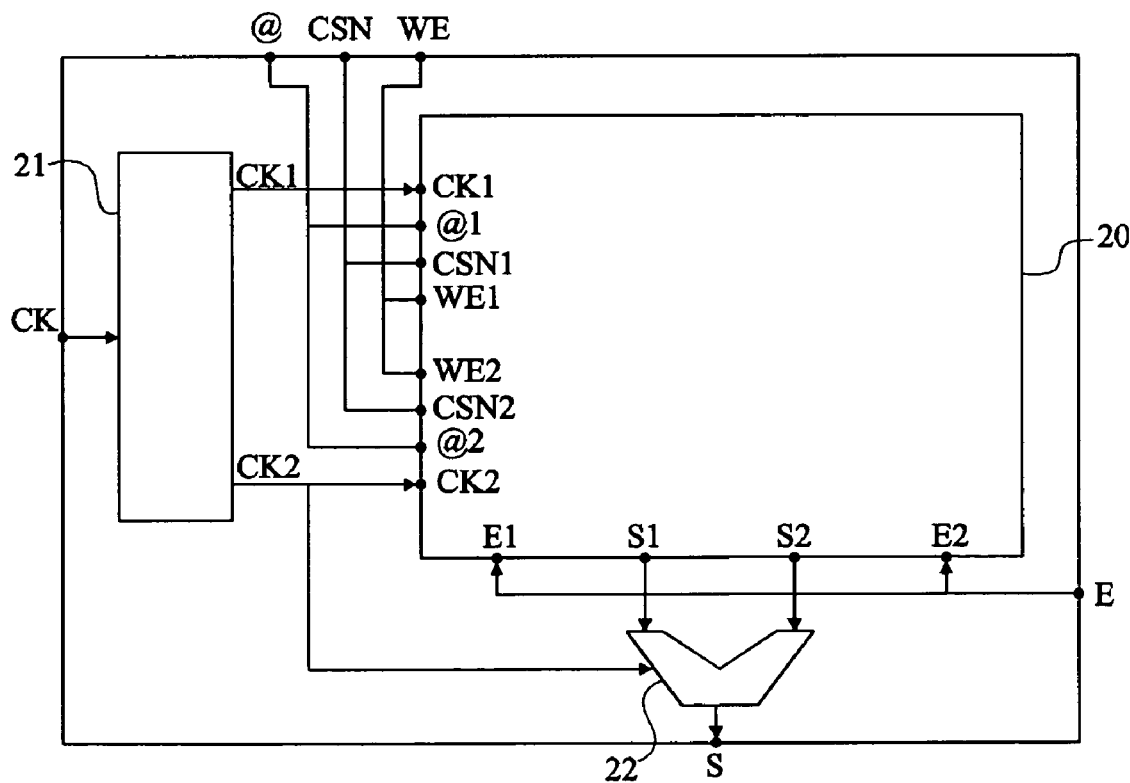
FIG. 4 is a diagram of a storage circuit according to an embodiment of the present invention.

FIG. 4 is a diagram of a storage circuit according to an embodiment of the present invention. The storage circuit comprises a dual-access memory 20 such as shown in FIG. 1. Based on a clock signal CK of frequency f, an activation circuit 21 provides two clock signals CK1 and CK2 of frequency f/2 and in phase opposition. Clock signals CK1 and CK2 are provided on clock inputs CK1 and CK2 of memory 20. Control inputs @1/@2, CSN1/CSN2, and WE1/WE2 respectively receive the same address signal @, the same memory selection signal CSN, and the same write/read signal WE. Outputs S1 and S2 of memory 20 are connected to two inputs of a multiplexer 22 providing an output signal S. Muliplexer 22 is controlled by one of clock signals CK1 and CK2, which in this example is clock signal CK2. Data inputs E1 and E2 of memory 20 receive a same input signal E.

Address signal @, memory selection signal CSN, and write/read signal WE are sampled alternately by each of memories Mem1 and Mem2 of memory 20. Control circuit C1 of memory Mem1 samples the control signals on an edge, rising or falling, of clock signal CK1 and control circuit C2 of memory Mem2 samples the control signals on an edge, rising or falling, of clock signal CK2. If a writing is requested, the data positioned on input E are written at the address indicated by address signal @. If a reading is requested, the data stored at the address indicated by address signal @ are provided on one of the two outputs S1 and S2, then on output signal S.

Figure 5:
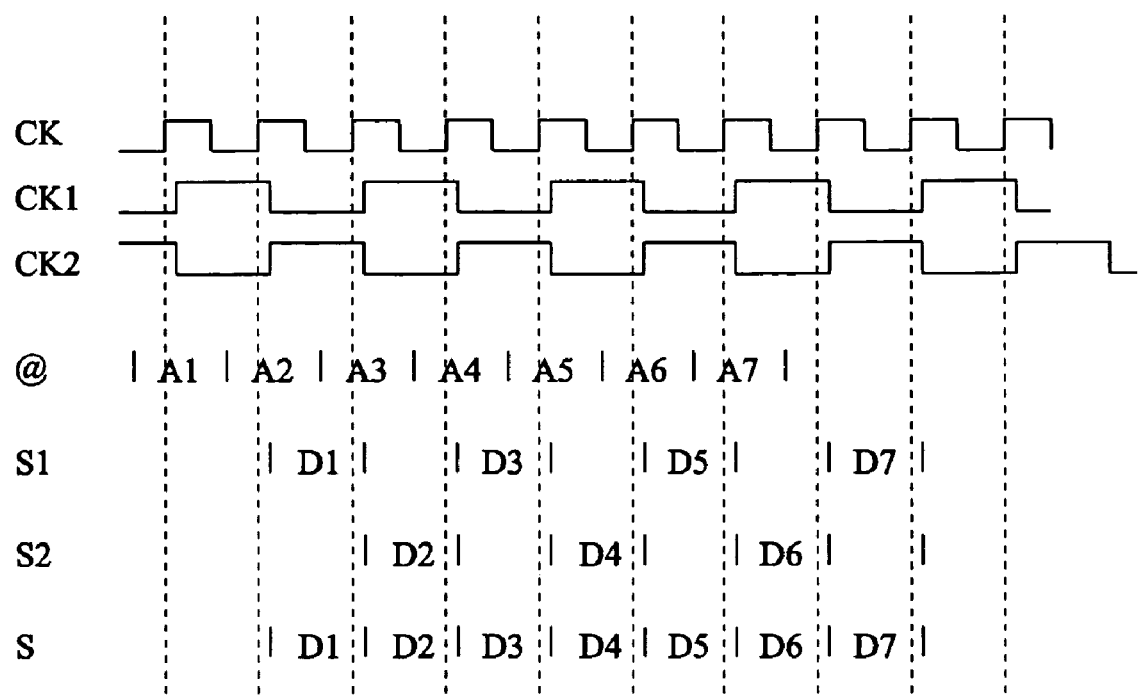
FIG. 5 is a timing diagram illustrating the values taken by various signals of the circuit shown in FIG. 4.

FIG. 5 is a timing diagram illustrating the values taken by various signals of the circuit shown in FIG. 4. Clock signal CK is a periodic signal, 10 rising edges being visible in FIG. 5. Clock signals CK1 and CK2, each having a frequency which is half that of clock signal CK, switch states on each rising edge of clock signal CK with a slight delay. Clock signals CK1 and CK2 are in phase opposition, and thus, on a rising edge of signal CK, one of signals CK1 and CK2 switches from "0" to "1", and the other signal switches from "1" to "0".

In this example, address signal @ switches values at each cycle of clock signal CK. A series of addresses A1, A2, to A7 is thus provided on address signal @ at the rate of clock signal CK Write/read signal WE, not shown, is positioned, in this example, permanently at the level corresponding to a reading. Readings are thus alternately performed in memory Mem1 and memory Mem2 at addresses A1 to A7.

Address signal @ is sampled by memory Mem1 at the first shown rising edge of clock signal CK. The minimum duration necessary to read from one of memories Mem1 and Mem2 is in this example equal to a little more than one period of clock signal CK that is, a little more than a half-period of clock signal CK1 or CK2. Data D1 stored at address A1 are transmitted on output S1 and on output S a little after the second rising edge of clock signal CK. Thus, address A1 is sampled at the beginning of the first shown cycle of clock signal CK and the corresponding data D1 are transmitted at the second cycle of clock signal CK.

Similarly, data D2 stored at address A2 are provided at output S2, then at output S, little after the third rising edge of clock signal CK. Thus, address A2 is sampled at the beginning of the second cycle of clock signal CK and the corresponding data D2 are transmitted at the third cycle of clock signal CK.

Data D3, D4, D5, D6, and D7 respectively stored at addresses A3, A4, A5, A6, and A7 are provided in the same way alternately on output S1 and output S2. The multiplexer selection, controlled by clock signal CK2, actually switches at each rising edge of clock signal CK The series of data D1, D2 to D7 at output S can thus be seen, the data provided on output S changing at each period of clock signal CK.

The storage circuit of FIG. 4 resembles a single-access memory comprising a group of control inputs CK, @, CSN, and WE as well as a data input E and a data output S. This storage circuit however exhibits a significant difference with a standard single-access memory. The maximum frequency of the clock signal controlling a standard single-access memory is set based on the minimum duration Dm necessary to perform a reading or possibly a writing. Now, for a given technology and for a given memory type (SRAM, DRAM), the minimum duration Dm of a single-access memory is identical to duration Dm of each memory Mem1 and Mem2 of a dual-access memory.

In the case such as that shown in FIG. 5 where a series of read operations is performed, the maximum data transmission frequency for a standard single-access memory substantially corresponds to the maximum transmission frequency of one of memories Mem1 or Mem2. The fact of alternately writing into memory Mem1 and into memory Mem2 enables obtaining at output S of the storage circuit a maximum data transmission frequency twice as high as the maximum transmission frequency of a standard single-access memory. Similarly, in the case where a series of write operations is desired to be performed, the maximum data input frequency on input E of the storage circuit is twice as high as the maximum frequency of data input into a single-access memory.

Figure 6:
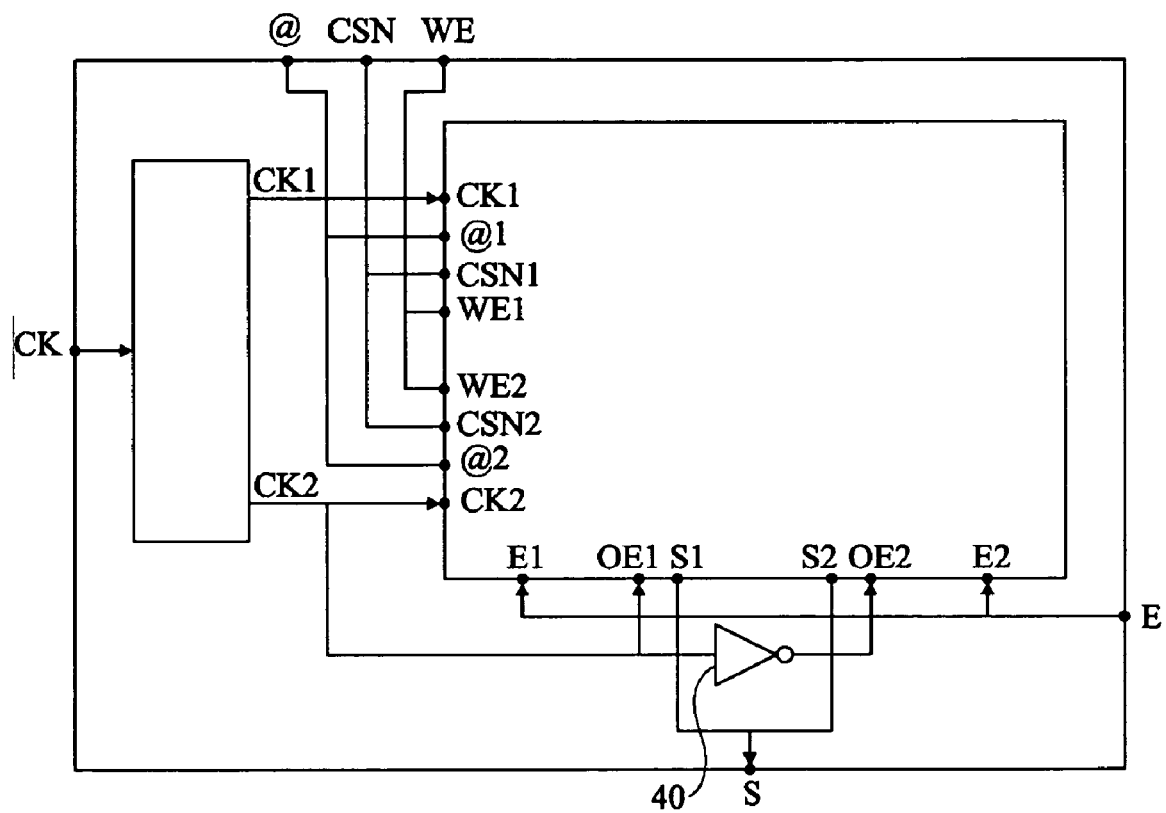
FIG. 6 is a diagram of a storage circuit according to another embodiment of the present invention.

FIG. 6 is a diagram of a circuit according to another embodiment of the present invention. This circuit is identical to the circuit of FIG. 4 except that it comprises no muliplexer to connect outputs S1 and S2 to output S. The dual-access memory further comprises two transmission validation inputs OE1 and OE2 which respectively control circuits R1 and R2 for reading from each of memories Mem1 and Mem2. The transmission validation inputs OE1 and OE2 are controlled by complementary signals. Input OE1 is in this example controlled by clock signal CK2. An inverter 40 receives clock signal CK2 and controls input OE2. Outputs S1 and S2 are directly connected to output S. Circuits R1 and R2 being in turn allowed to transmit, a single output S1 or S2 provides an output signal S at a given time.

The examples of embodiment of the present invention illustrated in FIGS. 4 and 6 both comprise a "synchronous" dual-access memory, the control input groups being sampled on an edge of clock signals CK1 and CK2. However, similar results may be obtained with an asynchronous dual-access memory for which a read or write operation is started when one of the signals of a group of control signals switches state. The asynchronous dual-access memory must be controlled to alternately activate its two control input groups.

Of course, embodiments of the present invention are likely to have various alterations, modifications, and improvements which will readily occur to those skilled in the art. In particular, activation circuit 21 may be formed in various manners. Each of clock signals CK1 and CK2 may for example be provided by means of a flip-flop controlled by clock signal CK, the output of each flip-flop being connected to its input via an inverter.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

A memory according to the embodiments of FIGS. 4 and 6 may be utilized in a variety of different types of electronic systems, such as a computer system.

The invention claimed is

1. A storage circuit using a dual-access memory, comprising an array of memory points and two reading/writing devices connected to the array, each reading/writing device being activable by one access, the storage circuit comprising:

means for alternately activating one access, then the other, with a maximum frequency equal to twice the maximum possible frequency of activation of a given access, at least two successive activations of said means controlling operations of the same type, reading or writing;

wherein each access of said dual-access memory comprises a group of control inputs enabling controlling a read or write operation in a memory point; and wherein the dual-access memory is synchronous, each group of control inputs comprising a clock input, the clock signal received on this clock input being a periodic signal, the signals received on the other control inputs of a group of control inputs being sampled on an edge, rising or falling, of the clock signal received on the clock input of the considered group of control inputs.

2. The circuit of claim 1, wherein said means for alternately activating one access, then the other, provide first and second clock signals from a reference clock signal, the first and second clock signals having a frequency which is half that of the reference clock signal and being in phase opposition, the first clock signal controlling the clock input of one of the groups of memory control inputs, the second clock signal controlling the clock input of the other group of memory control inputs.

3. The circuit of claim 1, wherein each group of control inputs comprises an address input, a memory selection input, and a read/write input.

4. The circuit of claim 3, wherein the two input addresses receive a same address signal, the two memory selection inputs receive a same memory selection signal, and the two write/read inputs receive a same write/read signal.

5. The circuit of claim 1, wherein said dual-access memory comprises two data inputs through which are input data which are desired to be written into the memory, each data input being associated with a group of control inputs, the two data inputs receiving a same data input signal.

6. The circuit of claim 1, wherein the memory comprises two data outputs on which the values read from the memory can be obtained, each data output being associated with a group of control inputs.

7. The circuit of claim 1, wherein the two memory data outputs are connected to two inputs of a multiplexer controlled by one of the first and second clock signals.

8. The circuit of claim 6, wherein said memory comprises two output validation inputs allowing or not data transmission on each of the data outputs, the two data outputs being connected to a same data output, the validation inputs receiving complementary control signals.

9. A method for activating a dual-access memory comprising an array of memory points and two reading/writing devices connected to the array, each reading/writing device being activatable by one access, the method comprising:

alternately activating one access, then the other, with a maximum frequency equal to twice the maximum possible frequency of activation of a given access, at least two successive activations controlling operations of the same type, reading or writing; and receiving a clock signal;

storing the states of control signals applied to the memory responsive to an edge of the clock signal; and controlling the reading/writing devices and array responsive to the stored control signals.

10. A memory, comprising:

a dual-access memory circuit operable to simultaneously process first and second data transfer operations in response to first and second data transfer commands, respectively, each data transfer command having an associated type and an associated maximum rate at which successive commands can be applied to the memory;

an activation circuit coupled to the dual-access memory circuit, the activation circuit operable to alternately apply first and second data transfer commands of the same type to the dual-access memory circuit, the activation circuit applying each of the first and second data transfer commands to the dual-access memory circuit at the associated maximum rate; and wherein the activation circuit is adapted to receive a clock signal having a frequency and is operable in response to this clock signal to develop complementary first and second clock signals each having a frequency equal to one-half the frequency of the clock signal, and wherein the dual-access memory circuit processes first data commands responsive to the first clock signal and second data commands responsive to the second clock signal.

11. The memory of claim 10 wherein the dual-access memory circuit comprises an SRAM memory.

12. The memory of claim 10 wherein the dual-access memory circuit comprises a DRAM memory.

13. The memory of claim 10 wherein each data transfer command comprises either a read command or a write command, each command being defined by a plurality of signals including a write enable signal, a chip selection signal, and address signals.

14. The memory of claim 10 wherein the activation circuit is further operable to receive read data from the dual-access memory circuit during read data transfer operations and is operable responsive to the second clock signal to alternately output read data corresponding to the first and second read data transfer commands.

15. The memory of claim 14 wherein the activation circuit includes a multiplexer having a control input coupled to receive the second clock signal, first and second inputs coupled to receive read data from first and second read data commands, respectively, and having an output on which the read data being output is provided.

16. An electronic system, comprising:

electronic circuitry coupled to a memory including, a dual-access memory circuit operable to simultaneously process first and second data transfer operations in response to first and second data transfer commands, respectively, each data transfer command having an associated type and an associated maximum rate at which successive commands can be applied to the memory;

an activation circuit coupled to the dual-access memory circuit, the activation circuit operable to alternately apply first and second data transfer commands of the same type to the dual-access memory circuit, the activation circuit applying each of the first and second data transfer commands to the dual-access memory circuit at the associated maximum rate; and wherein the activation circuit is adapted to receive a clock signal having a frequency and is operable in response to this clock signal to develop complementary first and second clock signals each having a frequency equal to one-half the frequency of the clock signal, and wherein the dual-access memory circuit processes first data commands responsive to the first clock signal and second data commands responsive to the second clock signal.

17. The electronic system of claim 16 wherein the electronic circuitry comprises computer circuitry.

18. The electronic system of claim 17 wherein the dual-access memory circuit comprises DRAM memory cells.

19. A method of controlling a dual-access memory having first and second control inputs, first and second read data busses, and first and second write data busses, the method comprising:
- applying the same write data on the first and second write data busses or the same read data on the first and second read data busses;
- applying first and second data transfer commands to the first and second control inputs, respectively, at a maximum rate at which such commands can be applied;
- outputting read data or capturing write data at a maximum rate associated with each of first and second data transfer commands to thereby provide an overall output or capture data rate that is twice the maximum rate of each.

20. The method of claim 19 wherein the first and second data transfer commands are applied responsive to clock signal.

21. The method of claim 19 wherein clock signal has a frequency and wherein the method further comprises generating first and second clock signals having frequencies that are one-half the frequency of the clock signal, and wherein the first and second data transfer commands are processed responsive to the first and second clock signals.

* * * * *